(12) United States Patent
Acosta et al.

(10) Patent No.: US 6,180,292 B1
(45) Date of Patent: Jan. 30, 2001

(54) STRUCTURE AND MANUFACTURE OF X-RAY MASK PELLICLE WITH WASHER-SHAPED MEMBER

(75) Inventors: Raul Edmundo Acosta, White Plains; Marie Angelopoulos; Steven Allen Cordes, both of Courtlandt Manor, all of NY (US)

(73) Assignee: International Business Machines Corporation, Armonk, NY (US)

( * ) Notice: Under 35 U.S.C. 154(b), the term of this patent shall be extended for 0 days.

(21) Appl. No.: 09/335,536

(22) Filed: Jun. 18, 1999

(51) Int. Cl.7 ........................................................ G03F 9/00
(52) U.S. Cl. .................. 430/5; 216/12; 430/966; 378/208
(58) Field of Search .......................... 430/5, 966; 428/14; 355/72, 74, 75, 77; 378/204, 208, 210; 216/12

(56) References Cited

U.S. PATENT DOCUMENTS

| | | | |
|---|---|---|---|
| 4,131,363 | 12/1978 | Shea et al. | 355/75 |
| 4,198,263 | 4/1980 | Matsuda | 156/639 |
| 4,539,070 | 9/1985 | Jarocinski et al. | 156/659.1 |
| 4,606,803 | 8/1986 | Lüthje et al. | 204/192 |
| 4,608,326 | 8/1986 | Neukermans et al. | 430/5 |
| 4,971,851 | 11/1990 | Neukermans et al. | 428/137 |
| 5,663,016 | * 9/1997 | Hong | 430/5 |
| 5,675,403 | * 10/1997 | Cerrina et al. | 355/75 |
| 5,793,836 | 8/1998 | Maldanado et al. | 378/35 |
| 5,809,103 | * 9/1998 | Smith et al. | 378/35 |

FOREIGN PATENT DOCUMENTS

| | | |
|---|---|---|
| 63-72119 | 4/1988 | (JP) . |
| 64-13551 | 1/1989 | (JP) . |

* cited by examiner

*Primary Examiner*—Christopher G. Young
*Assistant Examiner*—Saleha R. Mohamedulla
(74) *Attorney, Agent, or Firm*—Daniel P. Morris; Alvin J. Riddles

(57) ABSTRACT

A precise thickness bulk etchable wafer material, that is responsive to protection with an oxide that inhibits insertion of an etch responsiveness altering material, is assembled with a membrane material that is susceptible to deposition processes. A bulk etch then removes most of the wafer. The arrangement permits the strength and rigidity of the bulk spacer to serve to permit the finely controllable deposition processes for ultra thin and wider ranges of membrane materials, the selective protection for spacer shaping and finally, the removal by the low stress process of etching, of the unused bulk spacer material. An oxide layer is patterned on a bulk spacer material wafer that has a thickness of the gap between an X-ray mask and the to be patterned oxide. The oxide on the bulk spacer material prevents conversion, through the exposed surface of the bulk spacer material wafer, of a portion of the wafer that is to serve as the spacer to a different etch responsiveness from that of the bulk spacer material. The exposed bulk spacer material wafer is converted to a depth that will serve as the spacer and to protect the edges. The oxide is then removed. The membrane is deposited over the full surface of the bulk spacer material. The bulk wafer is removed down to the converted portion using the imparted different etch responsivness.

15 Claims, 2 Drawing Sheets

US 6,180,292 B1

STRUCTURE AND MANUFACTURE OF X-RAY MASK PELLICLE WITH WASHER-SHAPED MEMBER

CROSS REFERENCE

Cross reference is made to Application Ser. No. (09/335,980) filed Jun. 18, 2000, assigned to the assignee of this application and is part of an ongoing effort in this technology and which is incorporated herein by reference.

FIELD OF INVENTION

The invention relates to pattern replication using x-rays and in particular to an X-ray mask mounted device called a pellicle, which serves to provide a large pattern area, a wide choice of materials and greater precision in manufacturing.

BACKGROUND OF THE INVENTION AND RELATION TO THE PRIOR ART

The manufacturing of semiconductor integrated circuit devices is dependent upon the accurate replication of generated patterns onto the surface of a device substrate. This is usually accomplished by the production of a computer generated pattern into a chromium layer on a quartz substrate, and the pattern is then transferred via optical lithography. The replication operation is effected using a variety of processes, such as subtractive, for example etching; additive, for example deposition; and, by using such material modification techniques as oxidation, and ion implantation.

Heretofore in the art, optical lithography, which is a projection printing technique has been employed in the replication process. In optical lithography the mask is located some distance from the wafer to be exposed and a four or five times reduction between the mask image and the wafer image can be involved, which simplifies both the lithography and mask production and in turn provides tolerance of defects.

As the art is progressing, the desire for greater density is making the use of X-ray replication directly on the wafer very attractive. The considerations in using X-ray replication however are quite formidable. The X-ray technique involves proximity replication so that the X-ray mask images are made the same size as the final images on the wafer. Because of the one-to-one relationship of the image on an X-ray mask and the image formed on the wafer, any position errors in building the X-ray mask are replicated one for one onto the wafer. Thus, the position accuracy requirements for the fabrication of X-ray masks are very difficult to achieve and, as a result, X-ray masks are expensive to fabricate. In use, particles unavoidably settle on masks. The ability, previously available in optical lithography, of keeping settled particles outside of the depth of focus window in the replication, so that the particle is highly de-focused and does not print, is no longer available in the X-ray proximity replication. In some situations a particle that has settled on a mask can absorb X-ray photons and must be removed. A major source of a settling particle problem comes from the effect of the X-ray energy on the resist material that form the desired patterns. When the x-ray resist is irradiated, organic material is released from the resist. Because X-ray lithography is a proximity printing process, this material will travel the short distance between the mask and the wafer and then land on the x-ray mask. In particular, this material is prone to bonding to the x-ray mask absorber pattern. In a short time, this organic material begins to attenuate the x-rays resulting in longer exposure times, dimensional control problems, and pattern defects. This accumulation of contamination would ordinarily necessitate cleaning of the x-ray mask. However, due to the expense and fragility of the x-ray masks, and the risk involved with cleaning them, this is not considered to be a reasonable solution.

It is therefore important to protect the relatively delicate and not easily cleaned X-ray masks from contaminants and mechanical damage due to scratches and the like without introducing mechanical stresses that may affect the placement accuracy.

There has been some activity in the art directed to this problem in U.S. Pat. No. 5,793,836 in which a protective structure is described which provides a membrane that would lie between the mask and the wafer to assist in protecting the mask from contamination.

As progress with membranes advances needs are being encountered for larger pattern areas, greater precision in processing and availability of a wider range of materials.

SUMMARY OF THE INVENTION

In the invention, larger area X-ray masks, a wider range of X-ray mask membrane and mounting materials and greater precision in manufacture is achieved through the use of a membrane and rigid spacer type of pellicle mounting structure in which a precise thickness bulk etchable spacer material that is responsive to protection with an etch response conversion resist is employed together with a membrane material that is susceptible to vapor deposition processes. The arrangement permits etching operations to selectively remove portions of the bulk spacer and to be able to employ the finely controllable deposition processes for positioning the ultra thin membrane. The technique permits wider ranges of membrane materials, the selective protection for spacer shaping and the removal, by the low stress process of etching, of the unused bulk spacer material.

DESCRIPTION OF THE INVENTION

A pellicle structure and the fabrication thereof involves a membrane, that protects the X-ray mask from contaminating particles in use, and is made of materials that meet the about 1 micrometer thickness requirement encountered in the art, enlarged to an area much greater than available heretofore in the art, yet the pellicle can withstand the stress and wear encountered in use and in the operations in manufacturing.

Figure 1:
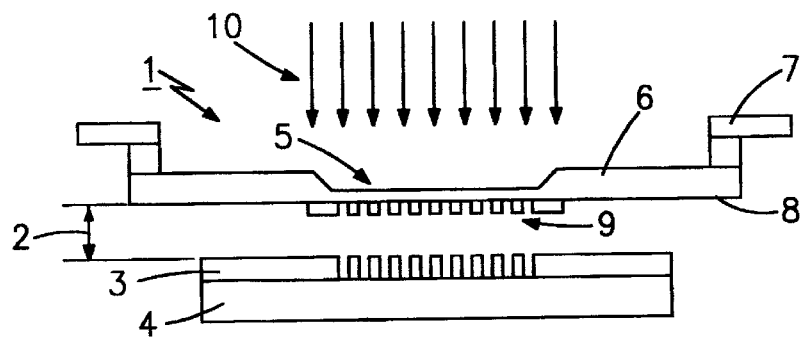
FIG. 1 is an exploded cross sectional diagram of the prior art x-ray lithography showing the configuration of the x-ray mask with respect to the device wafer.

Referring to FIG. 1 there is shown an exploded cross sectional view of a typical prior art x-ray mask 1 that is positioned in proximity printing position separated by a relatively narrow gap 2 of the order of about 5 to 40 micrometers in relation to an X-ray resist 3 that is on an integrated circuit wafer 4. The mask 1 is made up of a thinned region 5 about 1–5 micrometers thick and about 1 inch square that is supported at the periphery by a bulk support portion 6 of for example silicon, which in turn is mounted on and supported by a structural support ring 7 of a material such as pyrex(TM) that is about 4 inches in diameter. On the face 8 of the thin region 5 of the mask 1 there is an absorber pattern 9 of X-ray opaque material of for example Au, W, or TaSi. The absorber pattern 9 is transferred via x-rays 10 across the gap 2 onto a x-ray resist 3, which is on a device wafer 4. Several major problems are being encountered in the prior art of the type depicted in FIG. 1. One is that contaminating particles usually of organic material driven out of the resist 3 by the X-rays tend to settle on the mask and cause a need for cleaning. This problem is addressed in the art as illustrated in the referenced U.S. Pat. No. 5,793,836 by a pellicle that positions a contamination prevention membrane in the gap 2. Another is that the membranes must be so thin, of the order of a micrometer to prevent distortion, that they are not tolerant of much stress yet the both making the area of the pattern 9 larger and the processing conditions of many promising membrane materials such as Si, $Si_3N_4$, SiC or Diamond, will substantially add to stress on the membrane.

Figure 2:
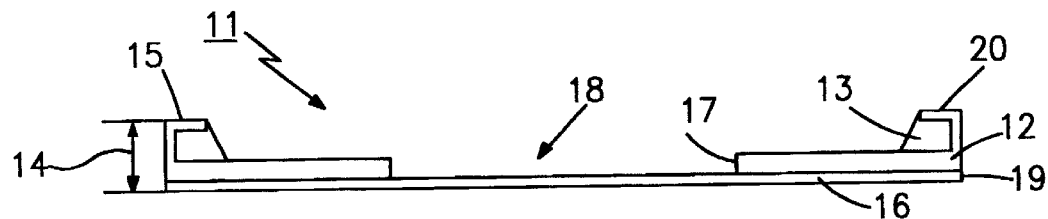
FIG. 2 is a cross sectional depiction of the membrane and spacer of the invention.

Referring to FIG. 2 there is shown a cross sectional depiction of the basic structural aspects of the membrane and rigid spacer pellicle 11 of the invention. The pellicle 11 of the invention can accommodate much larger masks approaching 4½ inches. The structure in FIG. 2 has a spacer member 12 that is formed from bulk material 13 that has been shaped from an original thickness dimension 14 leaving a peripheral ridge 15 of the original thickness 14 of the bulk material 13. The thickness 14 is the distance with relation to the surface 8 of the mask 1 that establishes the location of the membrane 16 in the gap 2 of FIG. 1. The thickness 17 of the portion of the spacer 12 at the opening 18 is large enough to accommodate the absorber pattern 9 when assembled as in FIG. 3 with about a micrometer of clearance between the absorber pattern 9 and the membrane 16. The membrane 16 is about 1 micrometer thick and is supported by and bonded to the spacer member 12 over all of it's surface 19 except in the opening 18. The thickness 14 at the peripheral ridge 15 operates to provide rigidity to the pellicle 11 and to prevent and to reduce stress on the membrane 16. In the structure of the invention the membrane 16 is completely flat and free of any bending requirement; so that it can be of a wider range of materials including for example an inorganic material such as a member of the group of Si, $Si_3N_4$, SiC or Diamond. The spacer member 12 formed from the bulk material 13 can be of any material into which a material with a different etch responsiveness can be introduced, so as to impart a different etch responsiveness between the bulk of the material 13 and the different etch responsiveness portion 20. The introduction of the material that imparts the different etch responsiveness can for example be by the precision processes of diffusion and implantation. The pellicle 11 of the invention can be adhesively attached to the mask 1 support ring 7 at the peripheral 15 surface through an external mounting member 21 which may be attached by gluing on one side to the peripheral surface 15 and on the other side to the underside of the support ring member 7.

Figure 3:
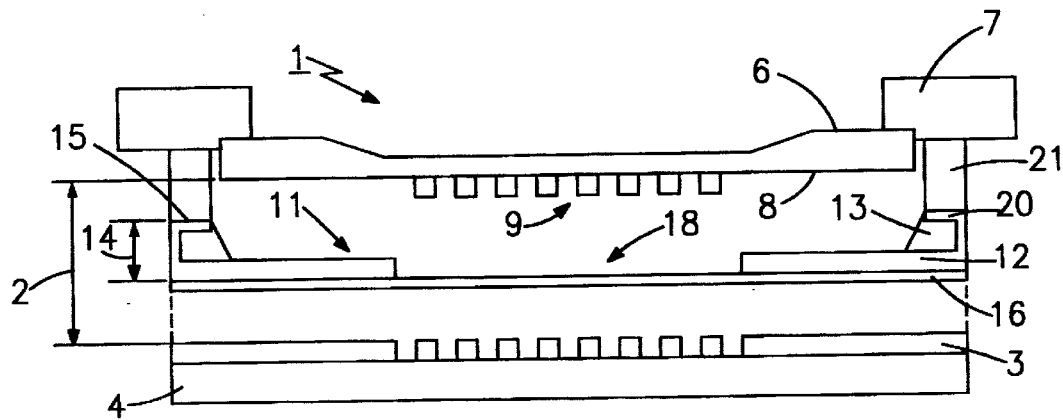
FIG. 3 is an exploded view of the membrane and spacer of the invention as it would be used in conjunction with an x-ray mask and wafer.

Referring to FIG. 3 there is shown an exploded view of an X-ray mask and wafer with the membrane and spacer of the invention positioned between the mask and the wafer. In FIG. 3 the same reference numerals as in previous figures are used. When the assembly of the spacer 11 and membrane 14 of the invention are in postion, the surface 15 of the peripheral ridge is in contact with the member 21 which in turn is in contact with the underside of the support ring 7 so that the thickness 17 establishes the location of the membrane 16 to the mask surface 8.

Figure 6:
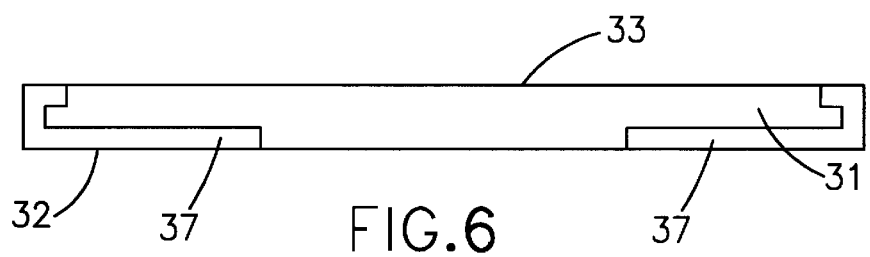
FIG. 6 is a cross sectional view of a partial pellicle product illustrating the bulk etchable spacer member after conversion and resist removal.
Figure 7:
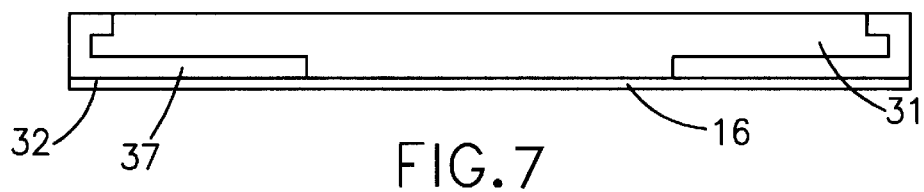
FIG. 7 is a cross sectional view of a partial pellicle product illustrating the deposition of the membrane on the converted and the bulk spacer member, and, FIG. 8 is a cross sectional view of results of the bulk etching operation on the partial product of FIG. 7 that produces the pellicle of the invention as illustrated in FIG. 2.
Figure 8:
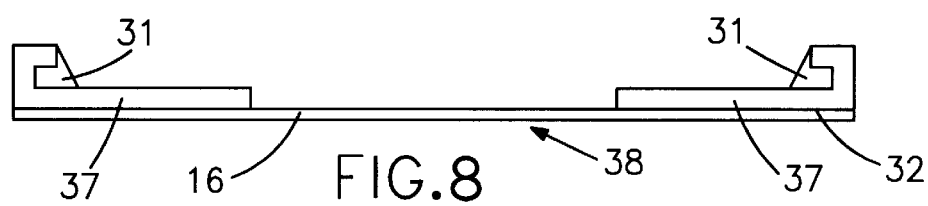

FIGS. 4–8 are cross sectional views of four partial products produced at steps in the fabrication of the pellicle 11 of the invention with the completed product being shown in FIG. 8. The reference numerals of the earlier Figures are used.

In accordance with the invention the structure of FIG. 2 is produced by interrelated etching and deposition operations to achieve the small thicknesses without damaging the membrane.

Figure 4:
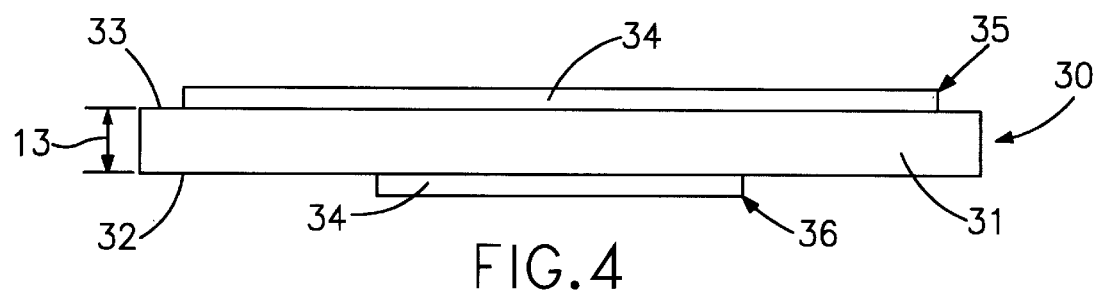
FIG. 4 is a cross sectional view of a partial pellicle product that shows the application of a resist pattern on a bulk etchable spacer member.

In general, a patterned silicon oxide layer is applied to a bulk material wafer. The oxide prevents diffusion, through the exposed surface of the bulk spacer material wafer, of a portion of the wafer that is to serve as the spacer to a different etch responsiveness from that of the bulk spacer material. The exposed bulk spacer material wafer is converted to a depth that will serve as the spacer and to protect the edges. The oxide is then removed. The membrane is deposited over the full surface of the bulk spacer material. The bulk wafer is removed down to the converted portion using the imparted different responsivness to an etch. The process is described in connection with FIGS. 4–8 using as an example silicon as the bulk spacer material, diffusion of boron for the etch responsiveness conversion and chemical vapor deposition for the application of a membrane of for example silicon nitride. The process is amenable to a wide range of additive and subtractive processes at temperatures up to about 1100 degrees C. Referring to FIG. 4 there is shown a cross sectional view of a partial product in which a patterned silicon oxide layer has been applied to a bulk etchable spacer member 30, such as Si. The bulk member 30 is wafer shaped, and is of a material 31 that has an etch responsiveness that can be locally converted to a region that has a different etch responsiveness, that is not flexible, that does not exhibit significant property changes in processing temperatures to around 1100 degrees C., and that has a thickness dimension 13 between surfaces 32 and 33 that is essentially the gap 2 of FIGS. 1 and 3.

The oxide 34, such as a thermal oxidation of the Si material 31, in a pattern 35 on surface 33 operates as a mask that prevents a conversion to a different etch responsiveness of the material 31 through surface 33, and the oxide pattern 36 on surface 32 operates as a mask to prevent the conversion of the material 31. The pattern 35 ends before the edges of the wafer 30 so that the conversion region will extend around the edges of the wafer and extend over a portion of the surface 33.

Figure 5:
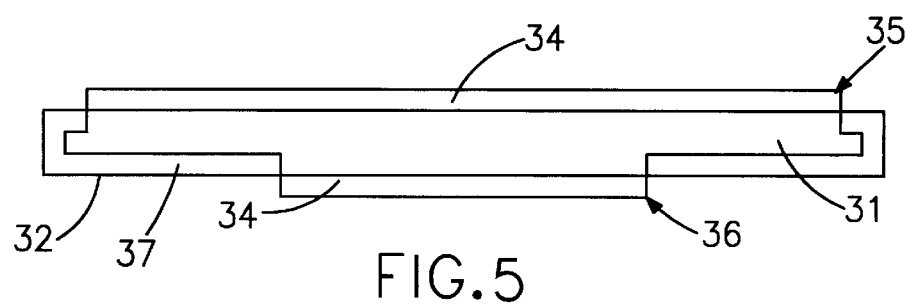
FIG. 5 is a cross sectional view of a partial pellicle product illustrating conversion of a portion of the bulk spacer member material to a material with a different etch response.

Referring to FIG. 5 there is shown an illustration of the conversion operation wherein the conversion is by the operation of diffusion of boron into the bulk material 31 that is not protected by the oxide 34. The boron diffusion into the material 31 converts a region 37 of the material 31, silicon in this example, to a boron doped region 37 that is less responsive to a standard silicon etch such as EPPW(ethylene diamine, pyrocatechol, pyrazine, water) which is an anisotropic etch for bulk silicon.

Referring to FIG. 6 in the cross sectional view of the partial pellicle product the patterns 35 and 36 of the oxide 34 are removed, which for the example silicon would be by the standard etch in the art of hydrofluoric acid.

Referring to FIG. 7 an about a 1 micrometer thickness of membrane 16, such as silicon nitride or boron diffused silicon, is placed on the surface 32 by the low stress process of relatively low temperature deposition, such as chemical vapor deposition.

As a result of the structure at this point in the overall process the surface is perfectly flat since the thin deposition and moderate temperature cycling for stress relief would not be damaging.

Referring to FIG. 8 there is illustrated a cross sectional view of the results of a bulk etching operation on the unprotected by conversion of the partial product of FIG. 7 thereby producing the pellicle of the invention as illustrated in FIG. 2. At this point in the process the structure permits the use of the chemically aggressive silicon etch EPPW to remove all the bulk silicon material 31 but which does not require a temperature excursion that might damage the membrane 16 where it is unsupported in area 38. The converted portion 37 extends around the edges forming the ridge 20 of FIG. 2 and operating to leave the material 31 at the edges for rigidity.

It will be apparent to one skilled in the art that the principles of the invention apply as well to appropriately mounted masks with shapes other than circular such as square.

What has been described is a membrane pellicle structure and process that produces a larger and higher precision membrane pellicle that is compatible with X-ray irradiation, is manufacturable and is amenable to the use of a wider range of materials.

What is claimed is:

1. A pellicle member for positioning a membrane member at a gap distance from an X-ray mask containing an absorber pattern area and for protection from contamination of said X-ray mask, comprising in combination:
   an assembly of a circular membrane member on a washer shaped spacer member, said spacer member having, first and second essentially parallel surfaces,
      a central opening through said spacer member having a diameter sufficient to accommodate said absorber pattern,
      a first thickness dimension between said first and second essentially parallel surfaces at the periphery of said washer shaped spacer member that is of the order of said gap distance, and,
      a second thickness dimension between said first and second essentially parallel surfaces at the edge of said central opening that is of the order of about 3 micrometers,
   said membrane member having a thickness dimension of the order of about 1 micrometer and being in intimate contact with and attached to the entire area of said second essentially parallel surface of said spacer member.

2. The pellicle member of claim 1 wherein said membrane member is of a material that is a member of the group of Si, $Si_3N_4$, SiC and Diamond.

3. The pellicle member of claim 2 wherein said spacer member is of boron doped silicon.

4. The pellicle member of claim 3 wherein said boron doping is by one of the processes of diffusion and implantation.

5. In pattern reproduction for use with X-rays wherein, a circular bulk mask support member having first and second essentially parallel surfaces is supported at the periphery by a ring member, said bulk mask support member having a central thinned region in said first surface and having an absorber pattern of X-ray opaque material on said second surface in registration with said thinned region, said mask being separated by a gap distance from a resist that is to be patterened by said x-rays on a wafer, the improvement comprising:
   a mask protecting pellicle, said pellicle including a membrane member on a washer shaped spacer member sub assembly,
      said spacer member having, first and second essentially parallel surfaces, a central opening through said spacer member having a diameter that will accommodate said absorber pattern, and at a peripheral region of said first surface said spacer increasing in thickness to about that of said gap distance,
      said membrane member being positioned in contact with all of said second surface of said spacer member and having a thickness dimension that is of the order of about 1 micrometer.

6. The improvement of claim 5 wherein said spacer member is of boron doped silicon.

7. The improvement of claim 6 wherein said boron doping is by one of the processes of diffusion and implantation.

8. The improvement of claim 7 wherein said membrane member is of a material that is a member of the group of Si, $Si_3N_4$, SiC and Diamond.

9. The process of manufacturing an X-ray pellicle with a membrane, comprising in combination the steps of:
   providing a specific thickness, with first and second faces, wafer, of bulk X-ray resistant material,
      said bulk material being susceptible to a change in etch responsiveness when converted by the insertion of an etch responsiveness altering material into said bulk material,
   applying a pattern of oxide to resist insertion of said etch responsiveness altering material on said first and second faces of said wafer,
   converting a portion of said wafer not covered by said oxide pattern to a selected depth by insertion of said etch responsiveness altering material,
   stripping said pattern of oxide from said wafer,
   depositing a membrane thickness layer of a bulk etch resistant material over said second face of said wafer, and,
   etching said wafer with an etch for said bulk material.

10. The process of claim 9 wherein said wafer is of a material taken from the group of Si, $Si_3N_4$, SiC and Diamond.

11. The process of claim 9 wherein said step of converting a portion of said wafer not covered by said oxide pattern to a selected depth by insertion of said etch responsiveness altering material involves one of the processes of diffusion and implantation.

12. The process of claim 9 wherein said bulk material is silicon and said bulk etch is the slicon etch EPPW.

13. The process of claim 12 wherein step of converting a portion of said wafer is by diffusion of boron.

14. The process of claim 9 wherein the deposition of said membrane involves one of the processes of low temperature deposition and chemical vapor deposition.

15. The process of claim 14 wherein said membrane is a material taken from the group of boron diffused silicon, silicon nitride and silicon carbide.

* * * * *